(12) United States Patent
Schreier et al.

(10) Patent No.: US 6,567,025 B2
(45) Date of Patent: May 20, 2003

(54) MULTI-BIT SIGMA-DELTA ANALOG TO DIGITAL CONVERTER WITH A VARIABLE FULL SCALE

(75) Inventors: Richard Schreier, North Andover, MA (US); Lawrence Singer, Bedford, MA (US); Jennifer A. Lloyd, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/071,983

(22) Filed: Feb. 5, 2002

(65) Prior Publication Data

US 2002/0105449 A1 Aug. 8, 2002

Related U.S. Application Data

(60) Provisional application No. 60/267,327, filed on Feb. 8, 2001.

(51) Int. Cl.[7] .............................................. H03M 3/02
(52) U.S. Cl. ...................................... 341/143; 341/139
(58) Field of Search .......................... 341/76, 77, 139, 341/143, 200

(56) References Cited

U.S. PATENT DOCUMENTS 4,851,841 A 7/1989 Sooch
5,241,310 A 8/1993 Tiemann
5,541,600 A * 7/1996 Blumenkrantz et al. .... 341/139

OTHER PUBLICATIONS

Kim et al., *A Single Chip Δ–Σ ADC with a Built–In Variable Gain Stge and a DAC with a Charge Integrating Subconverter for a 5 V 9600–b/s Modem*, IEEE Journal of Solid–State Circuits, vol. 30, No. 8 Aug. 1995, pp. 940–943.*

Li et al., *A Second–Order Sigma–Delta Modulator with built–n VGA to Improve SNR and Harmonic Distortion*, Proceedings of Ninth Great Lakes Symposium on VLSI, pp. 376–379, Mar. 1999, INSPEC Accession No. 6364399.*

* cited by examiner

Primary Examiner—Howard L. Williams
(74) Attorney, Agent, or Firm—Samuels, Gauthier & Stevens, LLP

(57) ABSTRACT

A multi-bit sigma-delta analog to digital converter has a quantizer, a loop filter circuit, and a digital to analog feedback circuit. The quantizer, loop filter, and digital to analog feedback circuit have a loop gain associated therewith. The quantizer and loop filter have a combined gain associated therewith. The full-scale of the digital to analog feedback circuit is varied. The combined gain of the quantizer and loop filter is also varied. More specifically, the combined gain of the quantizer and loop filter is varied in inverse proportion to the full-scale of the digital to analog feedback circuit to maintain the loop gain at a substantially constant level.

18 Claims, 4 Drawing Sheets

MULTI-BIT SIGMA-DELTA ANALOG TO DIGITAL CONVERTER WITH A VARIABLE FULL SCALE

PRIORITY INFORMATION

This application claims priority from U.S. Provisional Patent Application, Ser. No. 60/267,327, filed on Feb. 8, 2001. The entire contents are hereby incorporated by reference.

FIELD OF THE PRESENT INVENTION

The present invention is directed to multi-bit sigma-delta analog to digital converters ("multi-bit sigma-delta ADCs"). More particularly, the present invention is directed to multi-bit sigma-delta ADCs having a variable full scale.

BACKGROUND OF THE PRESENT INVENTION

Analog to digital converters ("ADCs") have been used in a variety of applications and fields of technology, such as communication applications, to provide an effective way of converting analog signals into digital signals. The effectiveness of the analog signal to digital signal conversion is related to the dynamic range of the analog to digital conversion.

For example, in communication applications, the dynamic range of the analog to digital conversion should be greater than 100 dB in order for the analog to digital conversion to not be a performance-limiting operation. Various designs have been proposed to enhance the dynamic range of the analog to digital conversion. An example of one proposed design is illustrated in FIG. 1.

In FIG. 1, an analog to digital converter 2 ("ADC") is used to convert analog signals to digital signals. The ADC 2 has a dynamic range associated therewith. The inherent dynamic range of the ADC 2 is enhanced by preceding the ADC 2 with a variable gain amplifier 1.

The variable gain amplifier 1 ("VGA") makes optimal use of the inherent dynamic range of the ADC 2 by providing greater amplification when the input signal is small. Moreover, the VGA 1 provides less amplification when the input signal is large. In this example, an analog signal is fed to the VGA 1 along with a control signal that controls the gain of the VGA 1. As noted above, the gain of the VGA 1 is inversely proportional to the magnitude of the input analog signal. The amplified signal is fed to the ADC 2. The ADC 2 converts the amplified analog signal into a digital signal, which is output from the ADC 2 for further processing, storage, etc.

Another example of a proposed design to enhance the dynamic range of the analog to digital conversion is illustrated in FIG. 2. In the design shown in FIG. 2, the dynamic range of the analog to digital conversion is enhanced by varying a full-scale of an ADC 20. If the ADC is designed such that its input-referred noise also gets smaller as the full-scale is reduced, then reducing the full-scale improves the ADC's ability to digitize low-level signals and thus extends its dynamic range.

As shown in FIG. 2, an analog signal is fed to the ADC 20 along with a variable reference signal. The variable reference signal controls the full-scale of the ADC 20. In this example, an explicit reference signal (for example, a reference voltage or reference current) is used to determine the full-scale of the ADC 20. Thus, controlling the magnitude of the variable reference level is sufficient to affect the desire control over the full-scale of the ADC 20. Constructing the ADC such that quantization noise dominates thermal noise ensures that the input-referred noise gets smaller as the full-scale is reduced.

A further example of a proposed design to enhance the dynamic range of the analog to digital conversion is illustrated in FIG. 3. In FIG. 3, a one-bit sigma-delta ADC is shown. In this example, the dynamic range of the one-bit sigma-delta ADC is enhanced by controlling a full-scale of the input signal going into a comparator 9. The full-scale of the input signal is controlled by varying the full-scale of a feedback digital to analog converter 7 ("feedback DAC"). The full-scale of the feedback DAC 7 is varied in response to a characteristic of a reference signal. The characteristic of the reference signal used to vary the full-scale of the feedback DAC 7 may be a voltage level thereof, a current level thereof, a frequency thereof, etc.

In this example, an analog input is fed into a fixed analog filter 5 along with an analog signal from the feedback DAC 7. The fixed analog filter 5 and the feedback DAC 7 comprise a loop circuit 3. The analog signal from the loop circuit 3 is fed to comparator 9, where the analog signal from the loop circuit 3 is converted to a one-bit digital output signal. As noted above, by changing the full-scale of the feedback DAC 7, the full-scale of the input signal into the comparator 9 is varied.

However, changing the full-scale of the feedback DAC 7 also changes signal levels within the loop circuit 3, namely the output of the fixed analog filter 5. For example, if the full-scale of the feedback DAC 7 is changed by a factor k>0, the signal coming from the loop circuit 3 is also scaled by a factor k. This scaling of the output from the loop circuit 3 is due to the fact that the signal from the feedback DAC 7 forms part of the input to a linear system, namely the fixed analog filter 5, thereby causing the output of the loop circuit 3 to also be scaled by the same factor k.

In this example, the scaling of the input signal does not adversely affect the output of the one-bit sigma-delta ADC since the one-bit sigma-delta ADC is only sensitive to the sign of the output signal of the loop circuit 3. Thus, the one-bit sigma-delta ADC can incorporate a variable gain function simply by providing means for changing the effective full-scale of the feedback DAC 7.

The second requirement for increased dynamic range, namely a reduction in input-referred noise as the full-scale of the ADC is reduced, can be accommodated by a variety of means. For example, a switched-capacitor ADC can use input capacitors that are so large that thermal noise is below the ADC's quantization noise. Alternatively, a switched-capacitor ADC can adjust the size of its input capacitors in response to, or in order to effect, changes in the ADC's full-scale. As a further example, if a single bit continuous-time sigma-delta ADC has an input-referred noise that is limited by the dynamic errors or the thermal noise of feedback DAC 7, reducing the full-scale of feedback DAC 7 will reduce the noise associated with feedback DAC 7 and thus reduce the input-referred noise of the ADC.

However, if the sigma-delta ADC employs multi-bit quantization, as is desired in the majority of applications using a sigma-delta ADC, simple scaling of the full-scale of the feedback DAC fails to provide the desired enhanced dynamic range.

As noted above, scaling the full-scale of the feedback DAC 7 scales the input to the quantizer. Since a multi-bit quantizer has some non-zero quantization thresholds, scaling the quantizer's input results in a change in its output and hence a change in the dynamics of the loop. This change in loop dynamics can be so severe as to make the loop unstable, thereby rendering the ADC inoperable.

Therefore, it is desirable to enhance the dynamic range of a multi-bit sigma-delta ADC in a same manner that a one-bit sigma-delta ADC is enhanced. Furthermore, it is desirable to enhance the dynamic range of a multi-bit sigma-delta ADC without causing the effectiveness of noise shaping to be degraded or a modulator to become unstable. Moreover, it is desirable to ensure that when the full-scale of the input signal to the quantizer of the multi-bit sigma-delta ADC is scaled by a factor k>0, the dynamics of the multi-bit sigma-delta ADC are essentially unchanged.

SUMMARY OF THE PRESENT INVENTION

A first aspect of the present invention is a method for varying an input full-scale level of a multi-bit sigma-delta analog to digital converter having a quantizer, a loop filter circuit, and a digital to analog feedback circuit. The quantizer, loop filter circuit, and digital to analog feedback circuit have a loop gain associated therewith, and the quantizer and loop filter circuit have a combined gain associated therewith. The method varies a full-scale of the digital to analog feedback circuit and varies the combined gain of the quantizer and loop filter circuit in inverse proportion to the full-scale of the digital to analog feedback circuit to maintain the loop gain at a substantially constant level.

A second aspect of the present invention is a multi-bit sigma-delta analog to digital converter. The multi-bit sigma-delta analog to digital converter includes a quantizer; a loop circuit, operatively connected to the quantizer, including a digital to analog feedback circuit; and a reference signal source to provide a reference signal. The quantizer and the loop circuit have a loop gain associated therewith. The digital to analog feedback circuit, in response to the reference signal, varies a full-scale thereof, and the quantizer, in response to the reference signal, changes thresholds thereof.

A third aspect of the present invention is a multi-bit sigma-delta analog to digital converter. The multi-bit sigma-delta analog to digital converter includes a quantizer; a loop circuit, operatively connected to the quantizer, including a digital to analog feedback circuit and a variable gain element; and a gain control signal source to provide a gain control signal and a full-scale control signal. The quantizer and the loop circuit have a loop gain associated therewith. The digital to analog feedback circuit, in response to the full-scale control signal, varies a full-scale thereof, and the variable gain element, in response to the gain control signal, varies a gain thereof.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE PRESENT INVENTION

As noted above, the dynamic range of an ADC can typically be enhanced by either scaling the input thereto or by controlling the full-scale of the ADC through varying a characteristic of a reference signal being fed to the ADC. However, in the case of a multi-bit sigma-delta ADC, the mere scaling of the input signal to the quantizer of the multi-bit sigma-delta ADC fails to enhance the dynamic range of the analog to digital signal conversion because the quantizer has several non-zero thresholds. Thus, the gain of a multi-bit quantizer does not track the input level in a manner analogous to the behavior of a one-bit quantizer, causing the effectiveness of noise shaping to be degraded or the multi-bit sigma-delta ADC to become unstable.

In other words, when signal levels within a multi-bit sigma-delta ADC are changed due to changing the full-scale of a feedback DAC, the loop gain changes and the noise transfer function of the multi-bit sigma-delta ADC will also be affected. Specifically, if H is the noise transfer function ("NTF") of the multi-bit sigma-delta ADC for one particular operating condition, then scaling the signal levels by a factor k will change the NTF to $H'=(kH)/(1+(k-1)H)$. This modified NTF has the same transmission zeros as H, but has different poles. The shift in the NTF poles can degrade the effectiveness of the noise shaping, or cause the multi-bit sigma-delta ADC to become unstable.

In recognition of the need to enhance the dynamic range of a multi-bit sigma-delta ADC while avoiding the problems of associated with the prior art approaches, the present invention provides a method and system to enhance the dynamic range of a multi-bit sigma-delta ADC without causing the effectiveness of noise shaping to be degraded or the multi-bit sigma-delta ADC to become unstable. Moreover, the present invention provides a method and system to ensure that when the full-scale of the multi-bit sigma-delta ADC is scaled by a factor k>0, the NTF of the multi-bit sigma-delta ADC is essentially unchanged.

Figure 1:
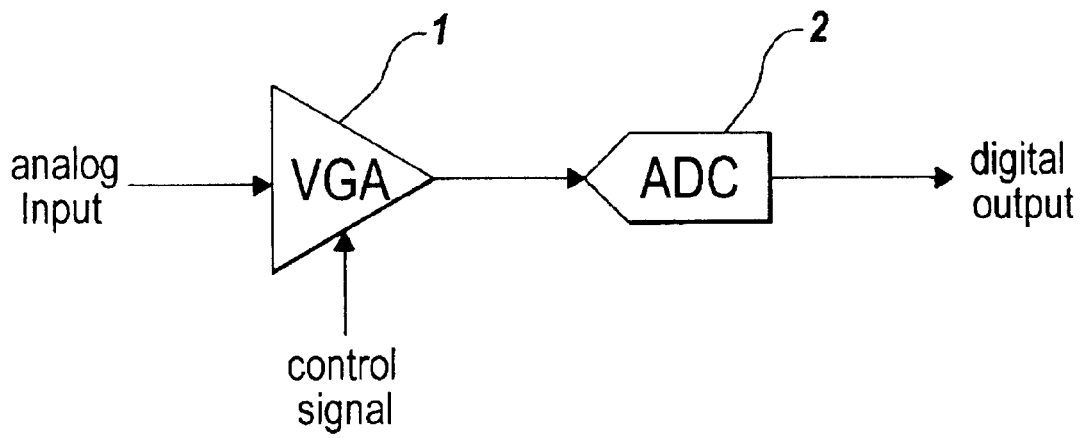
FIG. 1 a block diagram showing a prior art analog to digital conversion circuit.
Figure 2:
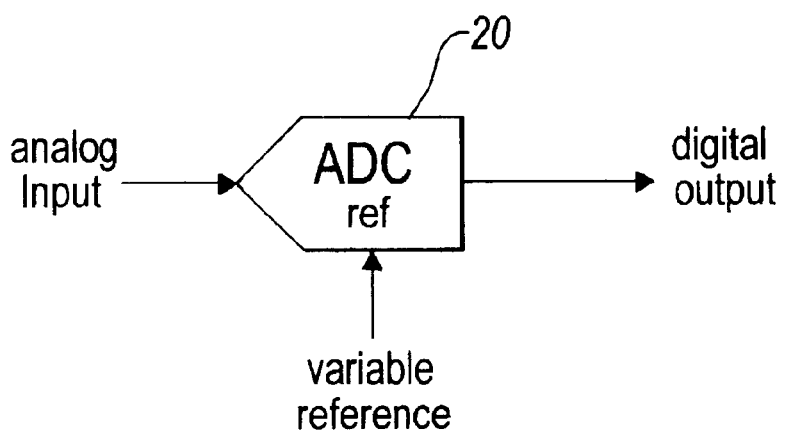
FIG. 2 a block diagram showing another prior art analog to digital conversion circuit.
Figure 3:
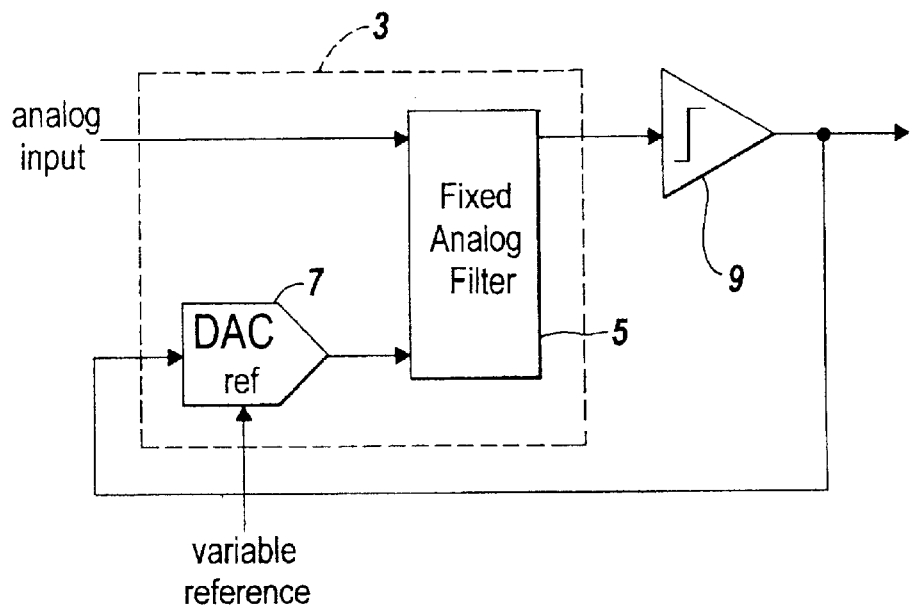
FIG. 3 a block diagram showing a third prior art analog to digital conversion circuit.

As noted above and illustrated in FIG. 3, the full-scale of a sigma-delta ADC can be changed by altering the full-scale of one or more of the feedback DACs. When the full-scale of a feedback DAC is changed by some factor, the signal levels within the loop circuit will scale by the same factor. This scaling within the loop circuit can cause the undesirable results noted above. Thus, the present invention provides ways to compensate for this scaling to enable enhancement without realizing the noted problems.

Figure 4:
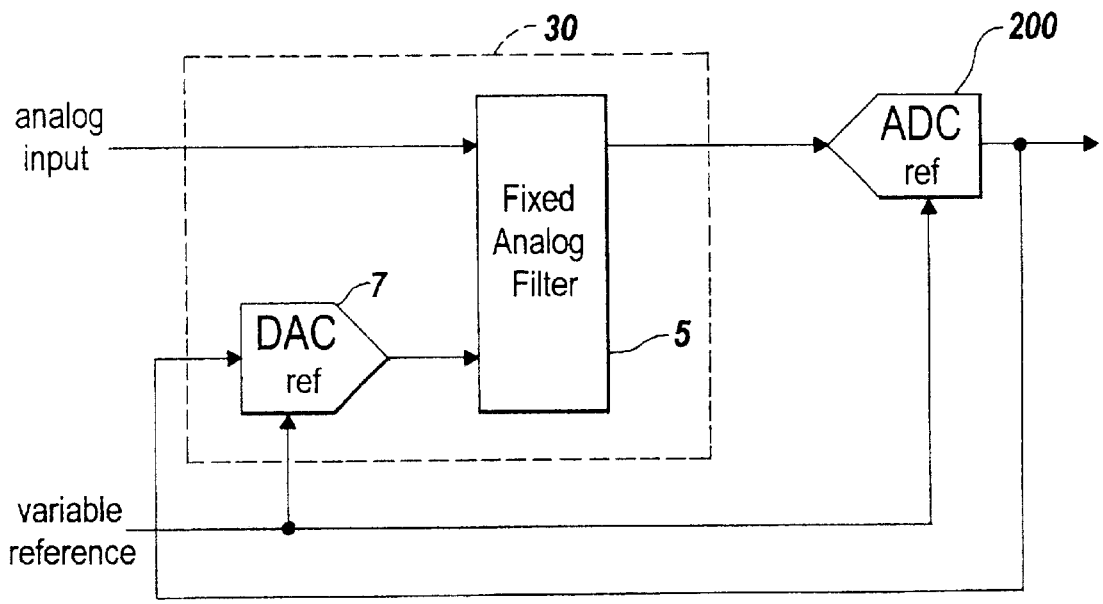
FIG. 4 is a block diagram showing one embodiment of a multi-bit sigma-delta analog to digital conversion circuit according to the concepts of the present invention.

In one embodiment of the present invention, according to the concepts of the present invention, the scaling of the signal levels within the loop circuit, due to the altering the full-scale of one or more the feedback DACs in the multi-bit sigma-delta ADC, is compensated for by changing the threshold levels of a quantizer within the multi-bit sigma-delta ADC by a factor similar to the factor by which the full-scale of the feedback DAC is altered. FIG. 4 illustrates a block diagram showing this embodiment of the present invention.

In FIG. 4, a multi-bit sigma-delta ADC is shown. In this example, the dynamic range of the multi-bit sigma-delta ADC is enhanced by controlling a full-scale of the input signal being fed to a multi-bit quantizer 200. The full-scale of the input signal being fed to the multi-bit quantizer 200 is controlled by varying the full-scale of a feedback digital to analog converter 7 ("feedback DAC"). The full-scale of the feedback DAC 7 is varied in response to a characteristic of a variable reference signal. The characteristic of the reference signal used to vary the full-scale of the feedback DAC 7 may be a voltage level thereof, a current level thereof, a frequency thereof, etc.

In this embodiment, as illustrated in FIG. 4, an analog input signal is fed into a loop filter circuit 5 along with an analog signal from the feedback DAC 7. The loop filter circuit 5 and the feedback DAC 7 comprise a loop circuit 30. The analog signal from the loop circuit 30 is fed to the multi-bit quantizer 200, where it is converted to a multi-bit digital output signal. As noted above, by changing the full-scale of the feedback DAC 7, the full-scale of the input signal into the multi-bit quantizer 200 is varied.

However, changing the full-scale of the feedback DAC 7 also changes signal levels within the loop circuit 3, namely the signal levels within the loop filter circuit 5. For example, if the full-scale of the feedback DAC 7 is changed by a factor k>0, the signal being fed to the multi-bit quantizer 200 from the loop circuit 30 is also scaled by a factor k. This scaling of the output from the loop circuit 30 is due to the fact that the signal from the feedback DAC 7 forms part of the input to the loop filter circuit 5, thereby causing the output of the loop circuit 30 to also be scaled by the same factor k.

In this embodiment of the present invention, as illustrated in FIG. 4, both the feedback DAC 7 and the multi-bit quantizer 200 receive the variable reference signal. Since both the feedback DAC 7 and the multi-bit quantizer 200 receive the variable reference signal, as the full-scale of the feedback DAC 7 changes, the thresholds of the multi-bit quantizer 200 change proportionately. The changing of the thresholds of the multi-bit quantizer 200 proportionately to the alteration of the full-scale of the feedback DAC 7 enables the multi-bit sigma-delta ADC to maintain a loop gain at a substantially constant level wherein the loop gain is the combined gain of the feedback DAC 7, the loop filter circuit 5, and the multi-bit quantizer 200. By maintaining a substantially constant loop gain, the multi-bit sigma-delta ADC realizes a variable full-scale without realizing degraded effectiveness of noise shaping or instability in the multi-bit sigma-delta ADC. Furthermore, since a multi-bit DAC has errors, such as dynamic errors and more particularly mismatch errors, which get smaller when the full-scale of the DAC is reduced, a reduction in the input-referred noise of the ADC as the full-scale of the ADC is reduced is facilitated by the use of the multi-bit feedback DAC 7. The combination of reduced input-referred noise and constancy of noise-shaping make changing the full-scale of the multi-bit sigma-delta ADC an effective means for increasing its dynamic range.

It is noted that although FIG. 4 illustrates only a single feedback DAC 7, multiple feedback DACs can be utilized in the multi-bit sigma-delta ADC. In the case where multiple feedback DACs are utilized in the multi-bit sigma-delta ADC, the thresholds of the multi-bit quantizer 200 are changed based on the overall effective gain that the multiple feedback DACs contributed to the loop circuit 30.

Figure 5:
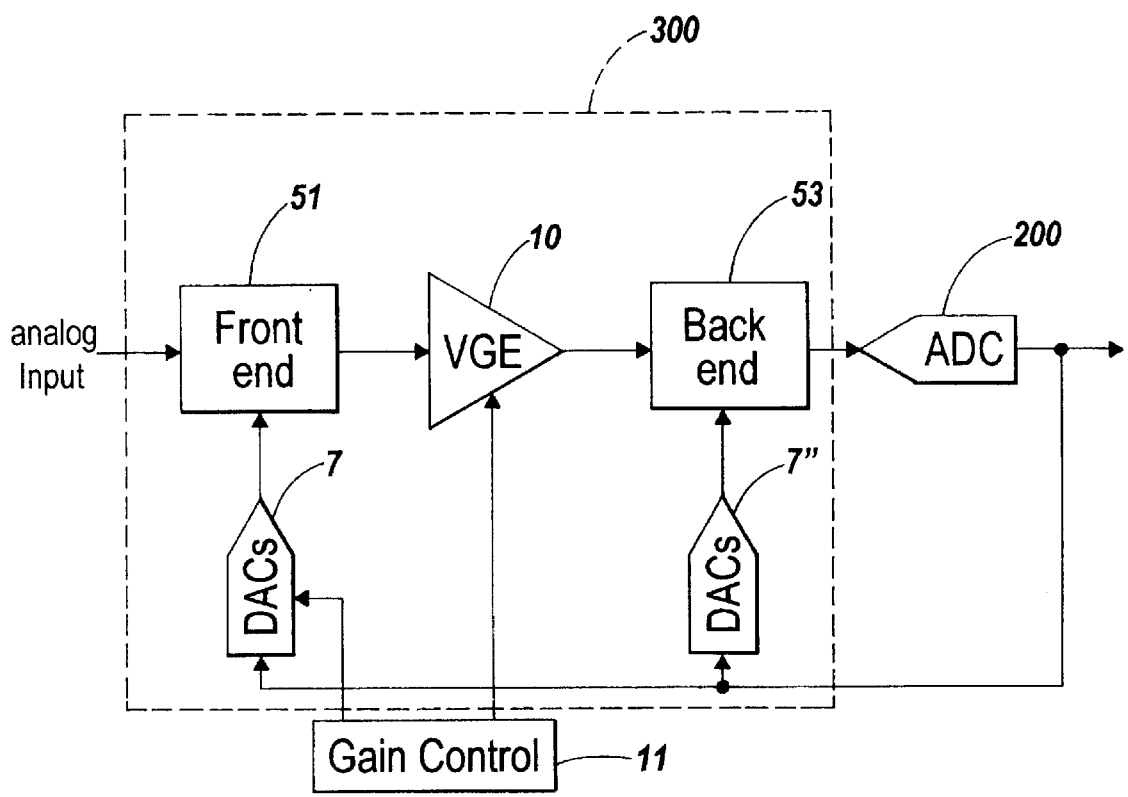
FIG. 5 is a block diagram showing a second embodiment of a multi-bit sigma-delta analog to digital conversion circuit according to the concepts of the present invention.

FIG. 5 illustrates another embodiment of the present invention wherein the scaling of the signal levels within a loop circuit of a multi-bit sigma-delta ADC, due to the altering the full-scale of one or more the feedback DACs in the multi-bit sigma-delta ADC, are compensated for by incorporating one or more variable gain elements within the loop circuit.

In FIG. 5, a loop filter circuit is divided into a front-end filter 51 and a backend filter 53. As illustrated in FIG. 5, an analog signal is fed to the front-end filter 51. The filtered signal is then fed to a variable gain element 10 ("VGE"). The gain of the VGE 10 is controlled by control signals from a gain control source 11. The signal from the VGE 10 is fed to the backend filter 53 before being fed to a multi-bit quantizer 200 where it is converted into a multi-bit digital signal. FIG. 5 further illustrates that a feedback DAC 7 is connected to the front-end filter 51. Moreover, an optional feedback DAC 7" can be connected to the backend filter 53.

The full-scale of the multi-bit sigma-delta ADC is controlled by varying the full-scale of the feedback DAC 7 or feedback DAC 7". The full-scale of the feedback DAC 7 (or feedback DAC 7") is varied in response to a characteristic of a variable reference signal received from the gain control source 11. The characteristic of the reference signal used to vary the full-scale of the feedback DAC 7 (or feedback DAC 7") may be a voltage level thereof, a current level thereof, a frequency thereof, etc.

In this embodiment, as illustrated in FIG. 5, an analog input signal is fed into a front-end filter 51 along with an analog signal from the feedback DAC 7. The front-end filter 51 and the feedback DAC 7 are part a loop circuit 300. Moreover, an analog output signal from the VGE 10 is fed into a backend filter 53, optionally along with an analog signal from the feedback DAC 7". The VGE 10, backend filter 53, and the feedback DAC 7" are also part the loop circuit 300. The analog signal from the loop circuit 300 is fed to the multi-bit quantizer 200, where it is converted to a multi-bit digital output signal. By changing the full-scale of the feedback DAC 7 or the full-scale of the optional feedback DAC 7", the full-scale of the multi-bit sigma-delta ADC is varied.

However, changing the full-scale of the feedback DAC 7 or the full-scale of the optional feedback DAC 7" also changes signal levels within the loop circuit 300. For example, if the full-scale of the feedback DAC 7 or the full-scale of the optional feedback DAC 7" is changed by a factor k>0, the signal being fed to the multi-bit quantizer 200 from the loop circuit 300 is also scaled by a factor k. This scaling of the output from the loop circuit 300 is due to the fact that the signal from the feedback DAC 7 or the optional feedback DAC 7" forms part of the input to the filters 51 and 53, thereby causing the output of the loop circuit 300 to also be scaled by the same factor k.

In this embodiment of the present invention, as illustrated in FIG. 5, the VGE 10 receives a gain control signal from the gain control source 11 that controls the gain of the VGE 10 in inverse proportion to the alteration of the full-scale of the feedback DAC 7. Since the gain of the VGE 10 changes in inverse proportion to the alteration of the full-scale of the feedback DAC 7, the multi-bit sigma-delta ADC can maintain a loop gain at a substantially constant level wherein the loop gain is the combined gain of the feedback DAC 7, the optional feedback DAC 7", the front-end filter 51, the backend filter 53, the VGE 10, and the multi-bit quantizer 200. By maintaining a substantially constant loop gain, the multi-bit sigma-delta ADC realizes an enhanced dynamic range without realizing degraded effectiveness of noise shaping or instability in the multi-bit sigma-delta ADC.

More specifically, if, for example, the full-scale of the feedback DAC 7 connected to the front-end filter 51 is changed by a factor k, signal levels in the front-end filter 51 will also scale by k. Changing the gain of the VGE 10 by 1/k is sufficient to achieve the desired compensation, since signal levels in the backend filter 53, in this example, will remain constant. It is noted that since sigma-delta modulators are typically tolerant of moderate parameter errors, the gain of the VGE 10 only needs to approximate the 1/k function.

It is noted that although FIG. 5 illustrates only a single feedback DAC 7 or a single optional feedback DAC 7", multiple feedback DACs can be utilized, in either instance, in the multi-bit sigma-delta ADC. In the case where multiple feedback DACs are utilized in the multi-bit sigma-delta ADC, the gain of the VGE 10 changes in inverse proportion to the overall effective gain that the multiple feedback DACs contributed to the loop circuit 300.

With respect to FIG. 5, the advantage of embedding the variable gain element 10 in the loop circuit 300 is twofold. First, when the full-scale is small, the gain of the VGE 10 is high and so the input-referred noise of the backend filter 53 is small. Second, nonlinearities in the VGE 10 are reduced by a factor equal to the in-band gain of the front-end filter 51 when referred to the input of the multi-bit sigma-delta ADC. Placing the VGE 10 closer to the input of the loop circuit 300 enhances the first advantage, while placing the VGE 10 closer to the output of the loop circuit 300 enhances the second. The optimal location of the VGE 10 can be determined by evaluating the implications on performance or power consumption.

Figure 6:
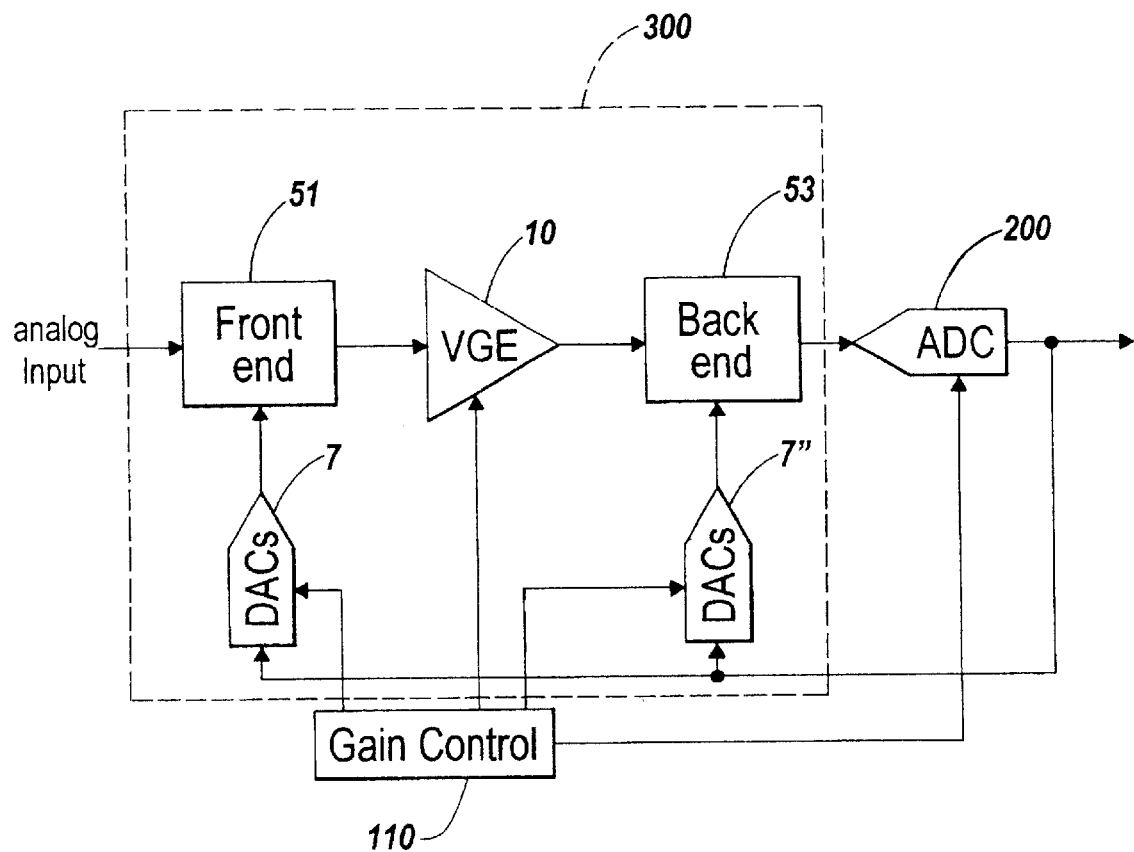
FIG. 6 is a block diagram showing a third embodiment of a multi-bit sigma-delta analog to digital conversion circuit according to the concepts of the present invention.

In a third embodiment of the present invention, as illustrated in FIG. 6, the scaling of the signal levels within a loop circuit of a multi-bit sigma-delta ADC, due to the altering the full-scale of one or more the feedback DACs in the multi-bit sigma-delta ADC, are compensated for by incorporating one or more variable gain elements within the loop circuit and by changing the threshold levels of a quantizer within the multi-bit sigma-delta ADC such that the combined gain of the variable gain elements and the quantizer changes by a factor similar to the factor by which the full-scale of the feedback DAC is altered.

In FIG. 6, a loop filter circuit is divided into a front-end filter 51 and a backend filter 53. As illustrated in FIG. 6, an analog signal is fed to the front-end filter 51. The filtered signal is then fed to a variable gain element 10 ("VGE"). The gain of the VGE 10 is controlled by control signals from a gain control source 11. The signal from the VGE 10 is fed to the backend filter 53 before being fed to a multi-bit quantizer 200 where it is converted into a multi-bit digital signal. FIG. 6 further illustrates that a feedback DAC 7 is connected to the front-end filter 51. Moreover, an optional feedback DAC 7" can be connected to the backend filter 53.

The full-scale of the multi-bit sigma-delta ADC is controlled by varying the full-scale of the feedback DAC 7 and possibly feedback DAC 7". The full-scale of the feedback DAC 7 (or feedback DAC 7") is varied in response to a characteristic of a variable reference signal received from the gain control source 11. The characteristic of the reference signal used to vary the full-scale of the feedback DAC 7 (or feedback DAC 7") may be a voltage level thereof, a current level thereof, a frequency thereof, etc.

In this embodiment, as illustrated in FIG. 6, an analog input signal is fed into a front-end filter 51 along with an analog signal from the feedback DAC 7. The front-end filter 51 and the feedback DAC 7 are part a loop circuit 300. Moreover, optionally, an analog input signal from the VGE 10 is fed into a backend filter 53 along with an analog signal from the feedback DAC 7". The VGE 10, backend filter 53, and the feedback DAC 7" are also part the loop circuit 300. The analog signal from the loop circuit 300 is fed to the multi-bit quantizer 200, where it is converted to a multi-bit digital output signal. By changing the full-scale of the feedback DAC 7 or the full-scale of the optional feedback DAC 7", the full-scale of the multi-bit sigma-delta ADC is varied.

However, changing the full-scale of the feedback DAC 7 or the full-scale of the optional feedback DAC 7" also changes signal levels within the loop circuit 300. For example, if the full-scale of the feedback DAC 7 or the full-scale of the optional feedback DAC 7" is changed by a factor k>0, the signal being fed to the multi-bit quantizer 200 from the loop circuit 300 is also scaled by a factor k. This scaling of the output from the loop circuit 300 is due to the fact that the signal from the feedback DAC 7 or the optional feedback DAC 7" forms part of the input to the filters 51 and 53, thereby causing the output of the loop circuit 300 to also be scaled by the same factor k.

In this embodiment of the present invention, as illustrated in FIG. 6, the VGE 10 receives a gain control signal from the gain control source 11 that controls the gain of the VGE 10 and the multi-bit quantizer 200 receives a reference signal from the gain control source 110 that changes the thresholds of the multi-bit quantizer 200. The change in the gain in the VGE 10 and the changing of the thresholds in the multi-bit quantizer 200 provide an overall gain change in inverse proportion to the alteration of the full-scale of the feedback DAC 7, thereby allowing the multi-bit sigma-delta ADC to maintain a loop gain at a substantially constant level wherein the loop gain is the combined gain of the feedback DAC 7, the optional feedback DAC 7", the front-end filter 51, the backend filter 53, the VGE 10, and the multi-bit quantizer 200. By maintaining a substantially constant loop gain, the multi-bit sigma-delta ADC realizes a variable full-scale without realizing degraded effectiveness of noise shaping or instability in the multi-bit sigma-delta ADC.

It is noted that although FIG. 6 illustrates only a single feedback DAC 7 or a single optional feedback DAC 7", multiple feedback DACs can be utilized, in either instance, in the multi-bit sigma-delta ADC.

A fourth embodiment of the present invention includes the multi-bit sigma-delta analog to digital converter having a replica element, such as a copy of the variable gain element or a scaled version of the variable gain element, whose gain is proportional to the gain of the variable gain element. In this embodiment, the present invention varies a gain of the variable gain element in inverse proportion to the full-scale of the digital to analog feedback circuit to maintain the loop gain at a substantially constant level by applying a signal that is proportional to the full-scale of the digital to analog feedback circuit to the replica element and adjusting the gain of the variable gain element and the replica of the variable gain element such that an output of the replica of the variable gain element is equal to a constant reference level.

A fifth embodiment of the present invention includes the multi-bit sigma-delta analog to digital converter having a replica element, such as a copy of the variable gain element or a scaled version of the variable gain element, whose gain is proportional to the gain of the variable gain element. In this embodiment, the present invention varies a gain of the variable gain element in inverse proportion to the full-scale of the digital to analog feedback circuit to maintain the loop gain at a substantially constant level by applying a signal that is proportional to the full scale of the digital to analog feedback circuit to the replica element and adjusting the full-scale of the digital to analog feedback circuit such that an output of the replica of the variable gain element is equal to a constant reference level.

The present invention may also track the gain of the variable gain element and further modify a full-scale of the digital to analog feedback circuit based on a tracked gain value.

It is noted in the embodiments described above the gain compensation can be distributed throughout the loop circuit by using several variable gain elements. At the circuit level, the full-scale of the feedback DAC can be changed continuously or in discrete steps, while the variable gain element can be a true variable gain amplifier in which the gain is controlled by an analog signal or it can be a block such as a programmable gain amplifier which has a discrete set of gain values. Also at the circuit level, the variable gain element can be implemented with a variable resistance, a variable capacitance, a variable transconductance, a variable attenuator, or other variable gain element.

It is further noted that if the application employs several quantizers, such as a multi-stage or cascade modulators, the above-described embodiments can be utilized in these applications to implement a variable full-scale.

In summary, the present invention varies an input full-scale level of a multi-bit sigma-delta analog to digital converter having a quantizer, a loop filter circuit, and a digital to analog feedback circuit. The quantizer, loop filter circuit, and digital to analog feedback circuit have a loop gain associated therewith, and the quantizer and loop filter circuit have a combined gain associated therewith. The present invention varies a full-scale of the digital to analog feedback circuit and varies combined gain of the quantizer and loop filter circuit in inverse proportion to the full-scale of the digital to analog feedback circuit to maintain the loop gain at a substantially constant level.

While various examples and embodiments of the present invention have been shown and described, it will be appreciated by those skilled in the art that the spirit and scope of the present invention are not limited to the specific description and drawings herein, but extend to various modifications and changes all as set forth in the following claims.

What is claimed is:

1. A method for varying an input full-scale level of a multi-bit sigma-delta analog to digital converter having a quantizer, a loop filter circuit, and a digital to analog feedback circuit; the quantizer, loop filter circuit, and digital to analog feedback circuit having a loop gain associated therewith; the quantizer and loop filter circuit having a combined gain associated therewith, comprising:
    (a) varying a full-scale of the digital to analog feedback circuit; and
    (b) varying the combined gain of the quantizer and loop filter circuit in inverse proportion to the full-scale of the digital to analog feedback circuit to maintain the loop gain at a substantially constant level.

2. The method as claimed in claim 1, wherein a circuit path defined from an output of the digital to analog feedback circuit through the loop filter circuit to an input of the quantizer has a total gain associated therewith and said (b) varies the total gain of the circuit path to maintain the loop gain at a substantially constant level.

3. The method as claimed in claim 1, wherein said (b) changes a plurality of thresholds of the quantizer by a similar factor as the full-scale of the digital to analog feedback circuit is varied to maintain the loop gain at a substantially constant level.

4. The method as claimed in claim 1, wherein the multi-bit sigma-delta analog to digital converter includes a variable gain element and said (b) varies a gain of the variable gain element to maintain the loop gain at a substantially constant level.

5. The method as claimed in claim 4, wherein said (b) varies a gain of the variable gain element and changes a plurality of thresholds of the quantizer to maintain the loop gain at a substantially constant level.

6. The method as claimed in claim 4, wherein said (a) varies a full-scale of the digital to analog feedback circuit by a factor of k and said (b) changes the gain of the variable gain element by approximately 1/k to maintain the loop gain at a substantially constant level.

7. The method as claimed in claim 6, further comprising:
    (c) tracking a gain of the variable gain element; and
    (d) further modifying a full-scale of the digital to analog feedback circuit based on a tracked gain value.

8. The method as claimed in claim 4, wherein the multi-bit sigma-delta analog to digital converter includes a replica element whose gain is proportional to the variable gain element and said (b) varies a gain of the variable gain element in inverse proportion to the full-scale of the digital to analog feedback circuit to maintain the loop gain at a substantially constant level by applying a signal that is proportional to the full scale of the digital to analog feedback circuit to the replica element and adjusting the full-scale of the digital to analog feedback circuit such that an output of the replica element is equal to a constant reference level.

9. The method as claimed in claim 4, wherein the multi-bit sigma-delta analog to digital converter includes a replica element whose gain is proportional to the variable gain element and said (b) varies a gain of the variable gain element in inverse proportion to the full-scale of the digital to analog feedback circuit to maintain the loop gain at a substantially constant level by applying a signal that is proportional to the full-scale of the digital to analog feedback circuit to the replica element and adjusting the gain of the variable gain element and the replica element such that an output of the replica element is equal to a constant reference level.

10. A multi-bit sigma-delta analog to digital converter, comprising:
    a quantizer,
    a loop circuit, operatively connected to said quantizer, including a digital to analog feedback circuit; and
    a reference signal source to provide a reference signal;
    said quantizer and said loop circuit having a loop gain associated therewith;
    said digital to analog feedback circuit, in response to said reference signal, varying a full-scale thereof;
    said quantizer, in response to said reference signal, changing thresholds thereof.

11. The multi-bit sigma-delta analog to digital converter as claimed in claim 10, wherein said quantizer changes thresholds thereof by a similar factor as the full-scale of said digital to analog feedback circuit is varied to maintain the loop gain at a substantially constant level.

12. A multi-bit sigma-delta analog to digital converter, comprising:
    a quantizer,
    a loop circuit, operatively connected to said quantizer, including a digital to analog feedback circuit and a variable gain element; and
    a gain control signal source to provide a gain control signal and a full-scale control signal;

said quantizer and said loop circuit having a loop gain associated therewith;

said digital to analog feedback circuit, in response to said full-scale control signal, varying a full-scale thereof;

said variable gain element, in response to said gain control signal, varying a gain thereof.

13. The multi-bit sigma-delta analog to digital converter as claimed in claim 12, wherein said variable gain element varies a gain thereof in inverse proportion to the varying of the full-scale of said digital to analog feedback circuit to maintain the loop gain at a substantially constant level.

14. The multi-bit sigma-delta analog to digital converter as claimed in claim 12, wherein said variable gain element is a variable gain amplifier.

15. The multi-bit sigma-delta analog to digital converter as claimed in claim 12, wherein said variable gain element is a variable resistance.

16. The multi-bit sigma-delta analog to digital converter as claimed in claim 12, wherein said variable gain element is a variable capacitance.

17. The multi-bit sigma-delta analog to digital converter as claimed in claim 12, wherein said variable gain element is a variable transconductance.

18. The multi-bit sigma-delta analog to digital converter as claimed in claim 12, wherein said variable gain element is a variable attenuator.

* * * * *